United States Patent
Demasius et al.

(10) Patent No.: US 10,504,575 B2
(45) Date of Patent: Dec. 10, 2019

(54) CAPACITIVE MATRIX ARRANGEMENT AND METHOD FOR ACTUATION THEREOF

(71) Applicants: Kai-Uwe Demasius, Leipzig (DE); Aron Kirschen, Dresden (DE)

(72) Inventors: Kai-Uwe Demasius, Leipzig (DE); Aron Kirschen, Dresden (DE)

( * ) Notice: Subject to any disclaimer, the term of this patent is extended or adjusted under 35 U.S.C. 154(b) by 0 days.

(21) Appl. No.: 16/340,595

(22) PCT Filed: Oct. 10, 2017

(86) PCT No.: PCT/EP2017/075872
§ 371 (c)(1),
(2) Date: Apr. 9, 2019

(87) PCT Pub. No.: WO2018/069359
PCT Pub. Date: Apr. 19, 2018

(65) Prior Publication Data
US 2019/0237120 A1    Aug. 1, 2019

(30) Foreign Application Priority Data

Oct. 10, 2016   (DE) .................. 10 2016 012 071
Mar. 21, 2017   (DE) .................. 10 2017 002 739

(51) Int. Cl.
*G11C 11/22*   (2006.01)
*G11C 11/24*   (2006.01)
(Continued)

(52) U.S. Cl.
CPC .......... *G11C 11/221* (2013.01); *G02B 26/005* (2013.01); *G02F 1/134336* (2013.01);
(Continued)

(58) Field of Classification Search
CPC ... G11C 11/221; G11C 11/2257; G11C 11/24; G11C 11/54; G11C 11/22; G02F 1/1676;
(Continued)

(56) References Cited

U.S. PATENT DOCUMENTS 3,476,954 A   11/1969   Wennik et al.
5,088,060 A    2/1992   Endoh et al.
(Continued)

FOREIGN PATENT DOCUMENTS

DE   102010045363 B4   9/2012
EP       1316090 B1    9/2005
(Continued)

OTHER PUBLICATIONS

Written Opinion of the International Searching Authority for International Application No. PCT/EP2017/075872 dated Jan. 25, 2018 with English translation.

(Continued)

*Primary Examiner* — Uyen B Tran
(74) *Attorney, Agent, or Firm* — Heslin Rothenberg Farley and Mesiti PC; Nicholas Mesiti

(57) ABSTRACT

The invention relates to a capacitive matrix arrangement that comprises an active medium, which is arranged in a layer between word lines and bit lines whose crossing points have capacitor cells, selectable by actuation of the word lines and bit lines, arranged at them with the interposed active medium, and to an actuation method, wherein the invention is based on the object of combining active actuation of capacitive elements in a matrix with the advantages of passive actuation. This is achieved by virtue of the word lines having a specific variable Debye length, i.e. consisting of a material with a variable mobile charge carrier concentration, and being arranged between the active medium and a non-active dielectric. The actuation is effected by controlling the action of an electrical field.

20 Claims, 9 Drawing Sheets

Figure 1:
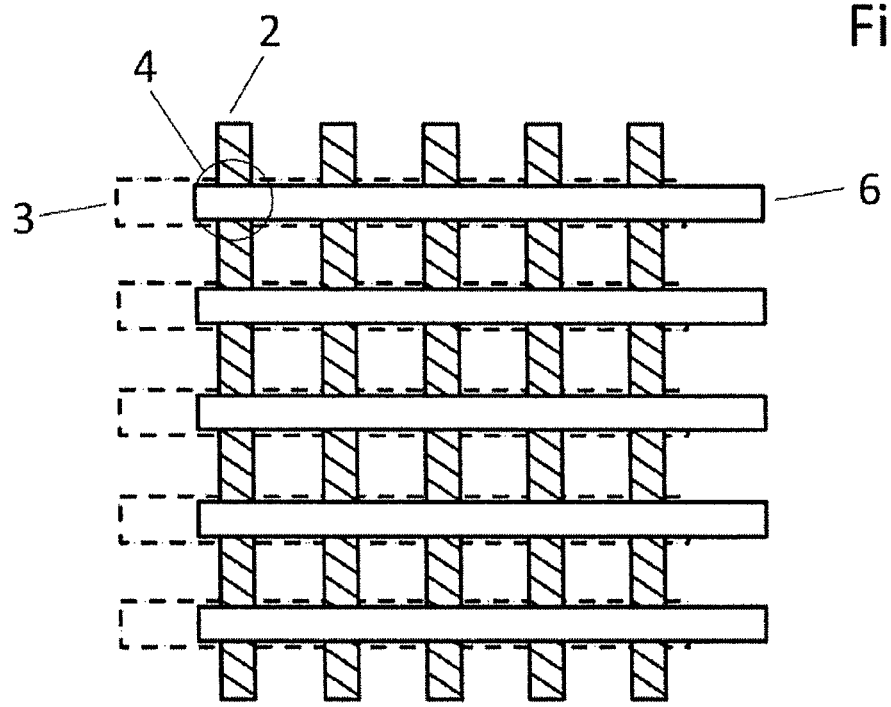

(51) Int. Cl.

| | | |
|---|---|---|
| *G02F 1/1676* | (2019.01) | |
| *G02B 26/00* | (2006.01) | |
| *G02F 1/1343* | (2006.01) | |
| *G02F 1/167* | (2019.01) | |
| *G11C 11/54* | (2006.01) | |
| *H01L 23/532* | (2006.01) | |
| *H01L 27/11507* | (2017.01) | |
| *H01L 49/02* | (2006.01) | |

(52) U.S. Cl.
CPC ............ *G02F 1/167* (2013.01); *G02F 1/1676* (2019.01); *G11C 11/2257* (2013.01); *G11C 11/24* (2013.01); *G11C 11/54* (2013.01); *H01L 23/53271* (2013.01); *H01L 27/11507* (2013.01); *H01L 28/60* (2013.01); *G02F 2201/122* (2013.01); *G11C 11/22* (2013.01)

(58) Field of Classification Search
CPC ............... G02F 1/134336; G02F 1/167; G02F 2201/122; G02B 26/005; H01L 23/53271; H01L 27/11507; H01L 28/60
See application file for complete search history.

(56) References Cited

U.S. PATENT DOCUMENTS

| | | | |
|---|---|---|---|
| 5,583,688 A | | 12/1996 | Hornbeck |
| 5,986,301 A | * | 11/1999 | Fukushima ........ H01L 27/11502 257/306 |
| 6,438,019 B2 | | 8/2002 | Hartner et al. |
| 7,616,497 B2 | | 11/2009 | Nam et al. |
| 8,694,452 B2 | | 4/2014 | Aparin et al. |
| 2002/0017667 A1 | | 2/2002 | Shimoda et al. |
| 2003/0053351 A1 | | 3/2003 | Oh et al. |
| 2003/0137865 A1 | | 7/2003 | Thompson et al. |
| 2006/0002168 A1 | | 1/2006 | Krieger et al. |
| 2006/0046344 A1 | | 3/2006 | Liljedahl et al. |
| 2008/0037324 A1 | * | 2/2008 | Wen-Tai Shuy ....... B82Y 10/00 365/185.05 |
| 2008/0043317 A1 | | 2/2008 | Hsu et al. |
| 2011/0090443 A1 | | 4/2011 | Han et al. |
| 2014/0175435 A1 | * | 6/2014 | Yamazaki ......... H01L 29/78618 257/43 |

FOREIGN PATENT DOCUMENTS

| | | |
|---|---|---|
| EP | 1798732 A1 | 6/2007 |
| WO | 200385675 A2 | 10/2004 |

OTHER PUBLICATIONS

International Search Report issued in PCT/EP2017/075872 dated Jan. 25, 2018.

\* cited by examiner

Fig. 6
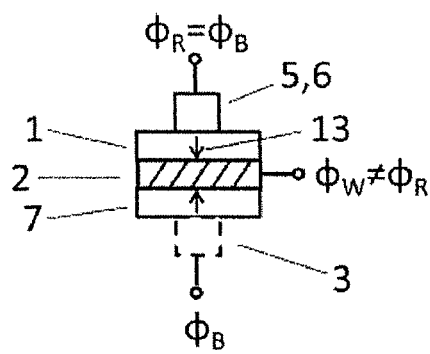
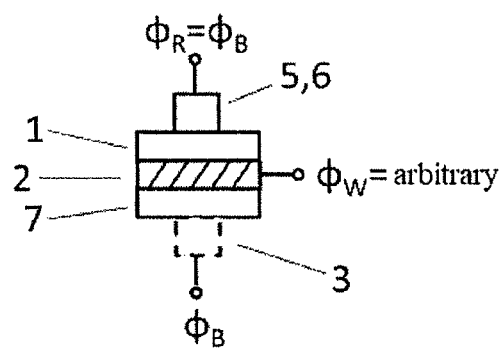
Fig. 7
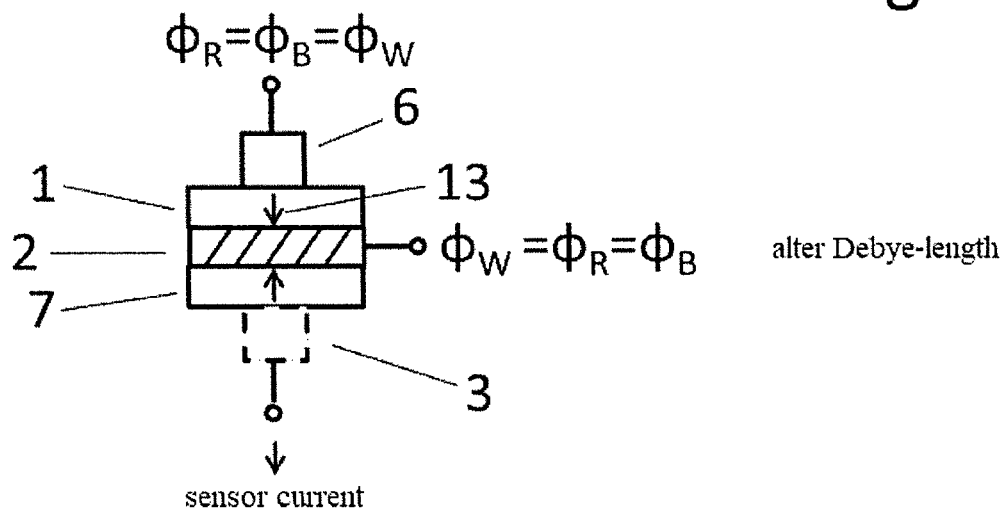

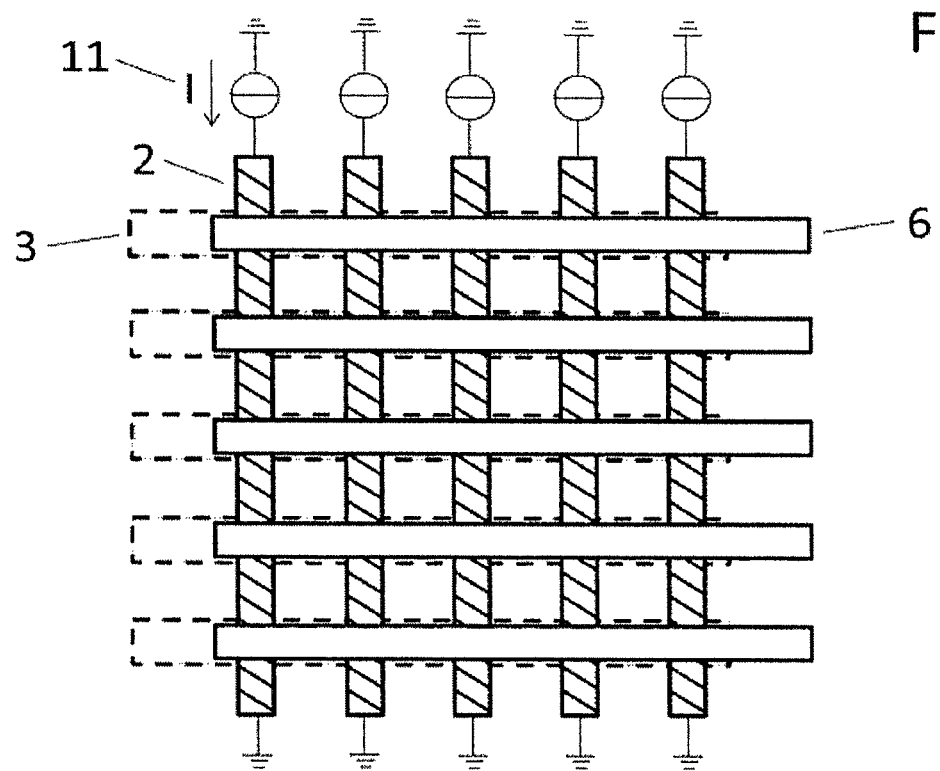

CAPACITIVE MATRIX ARRANGEMENT AND METHOD FOR ACTUATION THEREOF

CROSS REFERENCE TO RELATED APPLICATIONS

This application is the National Phase filing under 35 U.S.C. § 371 of International Application No.: PCT/EP2017/075872, filed on Oct. 10, 2017, and published on Apr. 19, 2018 as WO 2018/069359 A1, which claims priority to German Application No.: 10 2016 012 071.1, filed on Oct. 10, 2016 and German Application No.: 10 2017 002 739.0, filed on Mar. 21, 2017. The contents of each of the prior applications are hereby incorporated by reference herein in their entirety.

The invention relates to a capacitive matrix arrangement, comprising an active medium, which is embedded in a layer between a first set and a second set of respective parallel addressing electrodes. The active medium is capable of being actuated by electric fields. It may also itself possess an electric polarization. The addressing electrodes of the first set form word lines and the addressing electrodes of the second set form bit lines of the matrix arrangement. The word lines and bit lines intersect at crossing points, preferably orthogonally. Capacitor cells with the intervening active medium are arranged at the crossing points, being selectable by actuation of the word lines and bit lines.

The invention also relates to a method of actuation of a capacitive capacitor arrangement, wherein a capacitor arrangement situated at a crossing point between a word line and a bit line is selected by a potential selection of the word line being selected and corresponding to the crossing point and the bit line being selected and corresponding to the crossing point.

BACKGROUND ART

In many fields of microelectronics, a matrix is composed of storage, sensor, actuator or image elements. The individual elements must be actuated with an address, without disturbing neighboring cells. For storage components, such matrix arrangements play an important role in achieving high storage densities and rapid access speeds and obtaining a replacement for the typical flash storage of today.

One generally distinguishes between a passive and an active matrix (e.g., Willem den Boer: "Active Matrix Liquid Crystal Displays. Fundamentals and Applications" 1st Edition, Elsevier, 2005 and Temkar N. Ruckmongathan: "Addressing Techniques of Liquid Crystal Displays", Wiley, 2014).

The passive matrix consists of mutually perpendicular metal lines, which subtend the rows (bit lines (3)) and columns (word lines (2)). At the crossing points, cells (4) are defined, in which the active medium (1) can be actuated by a current flow (11) or an electric field. The benefit of this arrangement is that it is easy to produce and very high densities ($4F^2$ with F being the minimum featured size) can be achieved for storage chips. The major drawback hindering the application of a passive matrix thus far is the fact that the neighboring cells undergo parasitic interference. Only in organic ferroelectric storages can this principle be used, but this has drawbacks in terms of material wear and storage time (EP 1 316 090 B1; EP 1 798 732 A1; US 2006/0046344 A1; US 2002/0017667 A1; US 2003/0137865 A1).

The active matrix uses an active electronic element for the actuation of the individual elements. This can be a diode or a transistor. The diode would offer the advantage of a compact design and exactly the same high density for storage chips as in a passive actuation ($4F^2$). However, a diode in resistive elements often has the problem that the ON/OFF ratio is too low and in liquid crystal displays poor contrast is achieved. Furthermore, a diode itself acts as a capacitance and if the elements being actuated are themselves capacitances, as in the case of liquid crystal displays (US 2011/0090443 A1)/electronic paper (US 2008/0043317 A1)/micro mirror arrays (U.S. Pat. No. 5,583,688) or ferroelectric storages (EP 1 316 090 B1), an actuation is difficult (voltage divider). Diodes may often be used for resistive storage elements (US 2006/0002168 A1; WO 2003/85675 A2).

A transistor actuation (US 2003/0053351 A1; U.S. Pat. No. 6,438,019) enables significantly higher ON/OFF ratios and furthermore capacitances can be switched. Furthermore, the contrast is easy to control for monitor screens. The drawbacks are more manufacturing steps and usually a rather high space requirement for storage devices.

In general, one distinguishes in the case of storages with transistor actuation between the NAND (U.S. Pat. No. 5,088,060) and the NOR architecture (U.S. Pat. No. 7,616,497), wherein the NAND architecture makes possible high storage densities ($4F^2$), but requires significantly longer access times. The NOR architecture has a higher space requirement ($6$-$8F^2$), but on the other hand is fast (Betty Prince: "Semiconductor Memories: A Handbook of Design, Manufacture and Application", 2nd Edition, Wiley, 1995). The drawbacks of these two different architectures, along with corresponding storage materials, form one of the reasons why thus far there is no universal storage that replaces SRAM, DRAM, flash storage and hard computer disk. Therefore, an architecture which combines the benefits of the NAND and NOR architecture would be desirable. A universal storage would have to meet several specifications, among which are a high storage density, a high read and write speed, as well as a sufficiently large number of read/write cycles. Another criterion in terms of mobile applications is a low energy consumption. One possible alternative technology to the flash storages is ferroelectric storage, which possesses at present a high number of read/write cycles (1012-1015) and is roughly as fast as DRAM storage. The biggest problem thus far is the scalability and the storage density, since ferroelectric materials are little compatible with silicon-based CMOS logic.

New storage technologies are also important in terms of artificial neural nets. In traditional computers, the processing and storage of information are strictly separate, whereas the brain does not possess such a separation, and for this reason a nonvolatile storage solution must be created, one which can be easily embedded in the processing units. An artificial neural net consists of neurons and synapses, which store weights for example in the form of a resistance value. The neurons usually have a sigmoidal transient response for the activation function, so that a rather complicated transistor circuit is often necessary (U.S. Pat. Nos. 3,476,954; 8,694,452), having a high energy consumption and being difficult to produce. Likewise, so-called Rectified Linear Units (ReLU) are used as activation functions for artificial neurons.

In patent DE 10 2010 045 363 B4 there has already been published a semiconductor sensor which can modulate a static field into an alternating field. The patent deals with a modulation of the mobile charge carrier concentration in a semiconductor to control an electric field or potential. For this, the so-called Debye-length is utilized, which gives the typical shielding length of a field in a solid as $$L_D = \sqrt{\frac{\varepsilon_0 \varepsilon_r k_B T}{e^2 2n}},$$

where
$L_D$: is the Debye-length
$\varepsilon_0$: is the electric field constant
$\varepsilon_r$: is the relative dielectric constant of the material
$k_B$: is the Boltzmann constant
T: is the temperature
e: is the elementary charge
n: is the mobile charge carrier concentration (electron and hole concentration).
The field describes for low fields an exponential decrease in the solids by $$E = E_0 \cdot e^{-\frac{x}{L_D}},$$

where
E: is the electric field strength in the solid
$E_0$: is the field strength at the beginning of the solid with x=0
x: is the position in the solid.

If the mobile charge carrier concentration n is very low, the Debye-length is slight and the field can easily pass through the solid, provided the latter is significantly thinner than the Debye-length. But if the mobile charge carrier concentration is high, the field will be well shielded, and if the mobile charge carrier concentration is modulated, the transmitted field will be transmitted with different strength and be converted into an alternating field. In this way, a switch is realized for electric fields.

The problem which this invention proposes to solve is therefore to make possible an active actuation of capacitive elements in a matrix with the benefits of a passive actuation (simple manufacture, high storage density, fast access time). At the same time, it should be possible to model more easily the activation function of a neuron in regard to artificial neural nets.

SUMMARY OF THE INVENTION

This problem is solved by a capacitive matrix arrangement according to claim 1 and a method for the actuation of a capacitive capacitor arrangement according to [claim] 8. The dependent claims show favorable embodiments.

The solution in terms of the arrangement according to the invention consists in that, in a capacitive matrix arrangement of the kind mentioned above, the word lines at least in the area of the crossing points consist of a material with variable Debye length, i.e., a material with variable mobile charge carrier concentration, and are arranged between [the] active medium and a non-active dielectric, forming with them a layered arrangement, and the layered arrangement is situated between a reference electrode and the bit lines. Thus, in the layered arrangement, the sequence of active medium—word line—non-active dielectric exists. The layered arrangement may point both in a first layer with the active medium to the reference electrode and in a second layer to the bit lines. Now,
a first layer of the layered arrangement is chosen such that the active medium as seen from the word line is situated on the side with the reference electrode and
alternatively a second layer of the layered arrangement is chosen such that the active medium as seen from the word line is situated on the side with the bit lines.

In the word lines, for example, the transmission of an electric field is controlled by altering the charge carrier concentration. Between the word line and the reference electrode 5, 6 there is arranged a non-active dielectric, which serves purely insulation purposes.

The arrangement also makes possible the detection of electric fields in the active medium. For this, the potentials of the word line, bit line and the reference electrode are set equal to each other, and the Debye-length is altered in the word line being selected, so that a current can be measured in the selected bit line due to the influence of charges, since the electric field of the active medium which is located between the word line and reference electrode performs a switching from transmission to shielding or vice versa. If the active medium is located between bit line and word line, then the current must be measured in the strip reference electrode.

The invention described here makes possible the control of a capacitive coupling in a matrix arrangement. Hence, a field can be generated at one point for actuation purposes and measured at the same time. This actuation occurs without transistors, which combines the benefits of the passive matrix with benefits of the active matrix. In regard to storage technologies, the benefit of the NAND architecture with its high storage density and the benefit of the NOR architecture with high access speed are combined. The storage density amounts to $4F^2$, as in the case of a passive matrix or the NAND architecture, and the high access speed results from the use of metallic bit lines and reference electrodes, which have a lower resistance than transistors, so that the time constant for the charging of the bit line and the reference electrodes is reduced.

Basically the manufacture is almost exactly as easy as for a passive matrix, but without any parasitic coupling to neighboring cells being produced. The control of the transmitted electric field can be adaptive, which is important in displays for the contrast and could make possible multi-staged storage cells in storage technology.

The reference electrode may be a whole-surface electrode.

But it is also possible for the reference electrode to consist of multiple striplike strip reference electrodes. This opens the possibility of the strip reference electrodes being formed corresponding to the bit lines and being individually actuable.

A configuration of the strip reference electrodes corresponding to the bit lines basically means that they have a width on the same order of magnitude and in the same number. Preferably, the strip reference electrodes may run in the same direction as the bit lines. But it is also possible for them to cross each other, preferably orthogonally.

In one embodiment it is provided that the word lines consist of a semiconductor and are provided with p-doped and n-doped regions, wherein the level of the doping is chosen such that the Fermi levels of the p-doped and n-doped regions have the same distance from the Fermi level of the word lines and the band model of the resulting psn-junction possesses symmetry.

It may be provided here that the p-doped and n-doped regions are situated either to the side of the longitudinal extension of the respective word line or at an end face.

In order to prevent a complete word line from always having to be depleted or enriched in charge carriers, which is energy and time consuming, in another embodiment it is provided that the strip reference electrodes and the bit lines cross each other and at the crossing points the strip reference electrode is connected to the word line across the p-doped region and the bit line across the n-doped region or the strip reference electrode is connected across the n-doped region and the bit line across the p-doped region, respectively. This also avoids having to separately adjust the Debye-length change and the voltage between reference electrode and bit line.

It is also possible for the word lines to consist of a semiconductor and to be provided with different metal regions forming the Schottky contacts, wherein the work function of the metals is chosen such that the distances of the Fermi levels between the metal regions and the semiconductor are identical and the band model is symmetrical. The metal regions here are situated either to the side of the longitudinal extension of the respective word line or at an end face.

It is also possible to use a material with a metal-insulator junction for the word lines.

In one embodiment of the capacitive matrix arrangement, the active medium is an electrically polarizable dielectric storage material for the storage of data, particularly digital data.

Multiple matrix arrangements may also be stacked one on the other according to the invention, whereby the strip reference electrodes may at the same time form the bit lines for the cell situated on top. This arrangement is primarily advantageous for storage applications, since the storage density could be significantly increased in this way.

The active medium can also be a liquid-based or electrophoretic display means.

It is possible for the active medium to be a liquid crystal, which changes its direction of polarization and serves for the displaying of information.

Yet it is also possible for the active medium to consist of microcapsules for the electrophoretic actuation and display of information. This principle can be used in so-called electronic paper.

The active medium may also consist of liquid droplets and the electrowetting can be controlled by these. This may find use in EWOD (electrowetting on dielectric) technology in microfluidics.

Mechanical actuators may also be used as the active medium, which can be used for example in micro mirror arrays.

It may also be provided that mobile ions in a solid can be used as active medium for the storage of digital information. A ferroelectric may find use as the storage material here.

A further embodiment of the capacitive matrix arrangement calls for the word lines to consist of strontium titanate or titanium dioxide.

In one embodiment it is provided that the matrix arrangement involves a modeling of the activation function of an artificial neuron with a sigmoidal transmission behavior of the word lines or with a nonlinearity of the generated electric field. The word lines have a sigmoidal transmission behavior for the modeling of an activation function of a neuron. Likewise, the nonlinearity of the word lines can be used for the modeling of the Rectified Linear Units (ReLU).

The problem to be solved by the invention is also solved by a method of the kind mentioned above, wherein an electric field is generated in the capacitor cell being selected in that, when setting the state of the active medium an electric field is generated in the capacitor cell being selected by applying a potential difference between the bit line being selected and the reference electrode (5, 6) in the case of the first layer of the layered arrangement and selecting the potential of the word line being selected to be identical to the reference electrode (5, 6), or, in the case of the second layer of the layered arrangement, the potential of the word line is selected to be identical to the bit line, and in the word line being selected a long Debye-length is generated, i.e., a mobile charge carrier concentration which is so low that a sufficiently strong field is transmitted, producing an action in the active medium such that an electric field is transmitted at the crossing point to the bit line being selected, while at the word lines not being selected a short Debye-length is generated, i.e., a mobile charge carrier concentration which is so high that no action is produced in the active medium, and thus a poor transmission is established, or no potential difference is present between the bit line being selected and the reference electrode (5, 6), and the potential of the word line being selected is chosen to be different from the reference electrode (5, 6) and the bit line (3), and the Debye-length of the word line is chosen to be short, and the field lines of the electric field respectively end principally at the word line, so that an action is produced in the active medium, wherein a long Debye-length is established at the word lines not selected, so that an action is produced in the active medium, or the Debye-length in the word lines is held constant and the potentials on the word lines, bit lines and strip reference electrodes are chosen to be such that the potential difference between bit line and word line at the selected capacitor cell is present as the full voltage and at the capacitor cells not selected a portion of the full voltage is present, preferably ⅓, and the nonlinearity of the generated field ensures the suppression of the field in the capacitor cells not selected, and when determining the state of the active medium in the capacitor cell being selected, an electric field is measured by choosing the potentials of the bit lines, the reference electrodes (5, 6) and the word lines to be identical, and in the case of the first layer of the layered arrangement, a current is measured in the selected bit line that is generated during the changing of the Debye-length in the selected word line, and in the case of the second layer of the layered arrangement, the current is measured in a strip reference electrode corresponding to the crossing point.

It should be noted that a material with a short Debye-length behaves almost like a metal in the sense represented here and one with a short Debye-length behaves almost like an insulator in the sense represented here.

In the following, $\Phi_R$ describes the potential of the reference electrode, $\Phi_B$ the potential of the bit line and $\Phi_W$ the potential of the word line.

Now, in order to generate an electric field at one point in the active medium in the matrix, there are two possibilities, as described above:

1. Between the selected bit line and reference electrode in this case there exists a potential difference ($\Phi_B \neq \Phi_R$), so that an electric field is generated. If, now, a Debye-length is present in the word line being selected such that the electric field is well transmitted, an electric field will be transmitted to the reference electrode at the crossing point between the word line being selected and the bit line being selected, so that this can have an effect in an active medium (e.g., in the case of a ferroelectric, a polarization change which remains remanent). If, now, a short Debye-length is established in the word lines not being selected, i.e., a mobile charge carrier concentration which is so high that no effect is accomplished in the active medium, the electric field existing between the selected bit line and the reference electrode will be interrupted. It must be taken into consideration that in this case the word line behaves almost like a metal and an electric field would be formed in event of a potential difference between word line and reference electrode or bit line. If the first layer of the layered arrangement is present, i.e., if the active medium is situated between word line and reference electrode, the potential of the word line must accordingly be chosen to be identical to the reference electrode ($\Phi_B=\Phi_R$). The field forming between word line and bit line in the non-active dielectric is no further hindrance, since the non-active dielectric plays no role other than that of an insulation. Otherwise, if the second layer of the layered arrangement is present, i.e., the active medium is situated between word line and bit line, the potential of the word line should be chosen to be identical to the bit line ($\Phi_W=\Phi_B$).

2. An identical potential may also be present between the selected bit line and reference electrode ($\Phi_B=\Phi_R$), whereby the electric field in the active medium this time is generated by a short Debye-length in the selected word line. The word line then behaves again almost like a metal and if this has a potential difference to the bit line and thus also to the reference electrode 5, 6 ($\Phi_W \neq \Phi_B$), an electric field will be generated in the active medium. Now, if a long Debye-length is established on the word line not selected, i.e., so low a mobile charge carrier concentration that a strong enough field is transmitted to produce an effect in the active medium, so that the potential of the bit line and the reference electrode 5, 6 is well transmitted, the electric field from the active medium will vanish. In this case, the word line potential can be chosen arbitrarily, since this no longer achieves any effect through the transmission. That is, the Debye-length between selection and non-selection behaves here precisely the reverse of option 1.

In another embodiment of the method, it is provided that the actuation of the complete matrix in the case of the first layer of the layered arrangement, is done in such a way that, when a potential difference is present between a strip reference electrode corresponding to the crossing point and the corresponding bit line, an identical potential to that of the bit line being selected is applied to the word lines not being selected and the strip reference electrodes not selected, and the bit lines not being selected are provided with an identical potential to the corresponding strip reference electrode, and in the case of the second layer of the layered arrangement, it is done in such a way that, when a potential difference is present between a strip reference electrode corresponding to the crossing point and the corresponding bit line, an identical potential to the corresponding strip reference electrode is applied to the word lines not being selected and the bit lines not being selected, and the other strip reference electrodes are provided with the identical potential to that of the bit line being selected.

Alternatively, it may be provided that the actuation of the complete matrix occurs in such a way that, when no potential difference is present between the selected bit line and selected strip reference electrode (6), with the strip reference electrodes and bit lines being arranged in parallel, the bit lines not being selected and the strip reference electrodes not being selected are placed at the same potential as the selected word line and the potential of the word lines not being selected can be chosen arbitrarily.

Insofar as psn-junctions are provided, a blocking voltage may be applied to the psn-junctions to deplete the mobile charge carrier concentration in the word lines, insofar as a long Debye-length is desired, and a forward voltage may be applied to enrich the mobile charge carrier concentration in the word lines, insofar as a short Debye-length is desired, each time applying an antisymmetrical voltage to the p-regions and n-regions.

Furthermore, a current flow through the word line being selected may produce a slight temperature rise and a metal-insulator junction may trigger a change in the mobile charge carrier concentration in the word line being selected.

BRIEF DESCRIPTION OF THE DRAWING FIGURES

Figure 2:
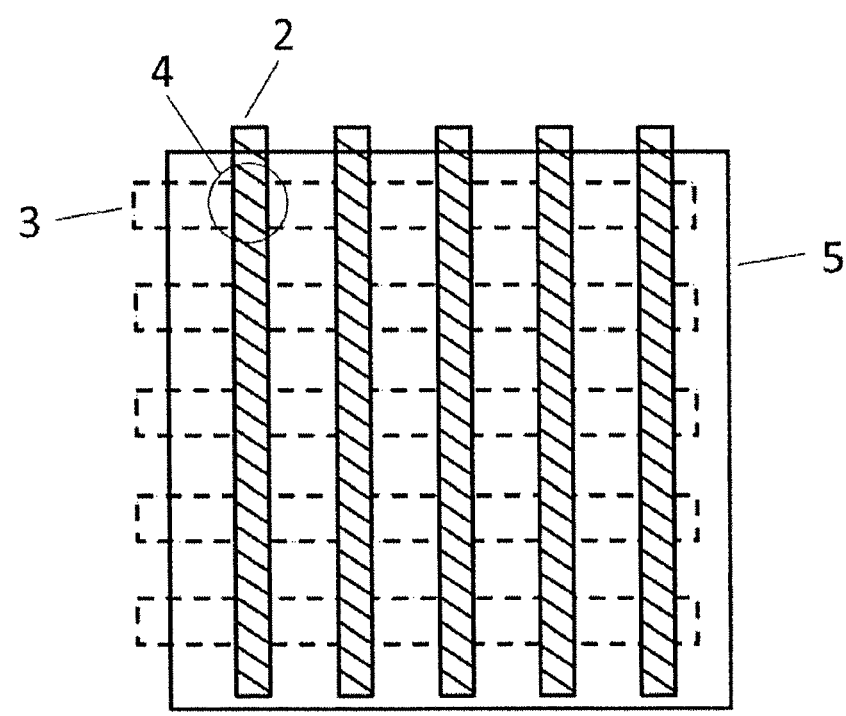
Figure 3:
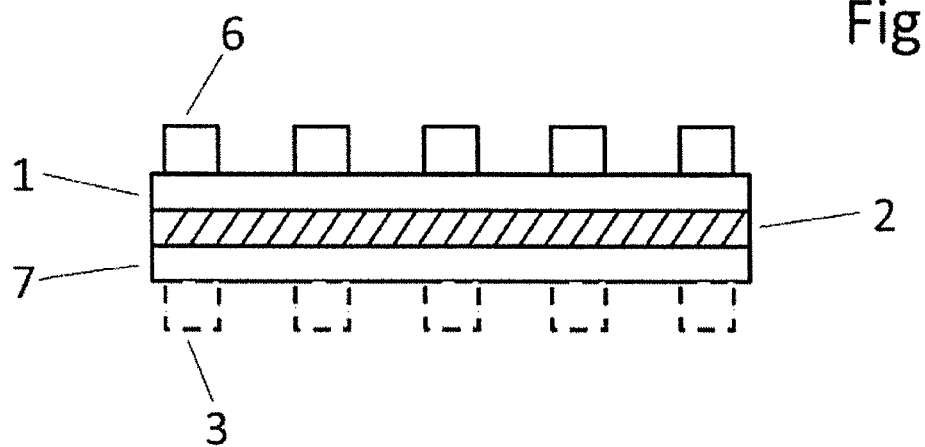
Figure 4:
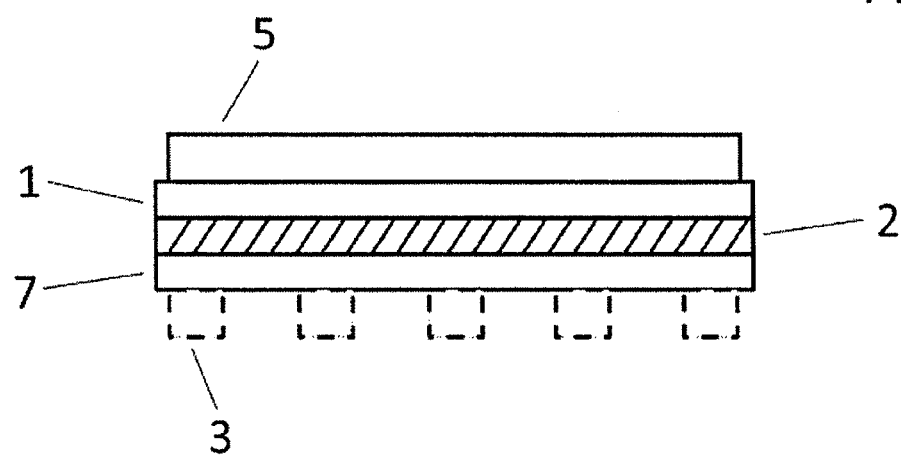
Figure 14:
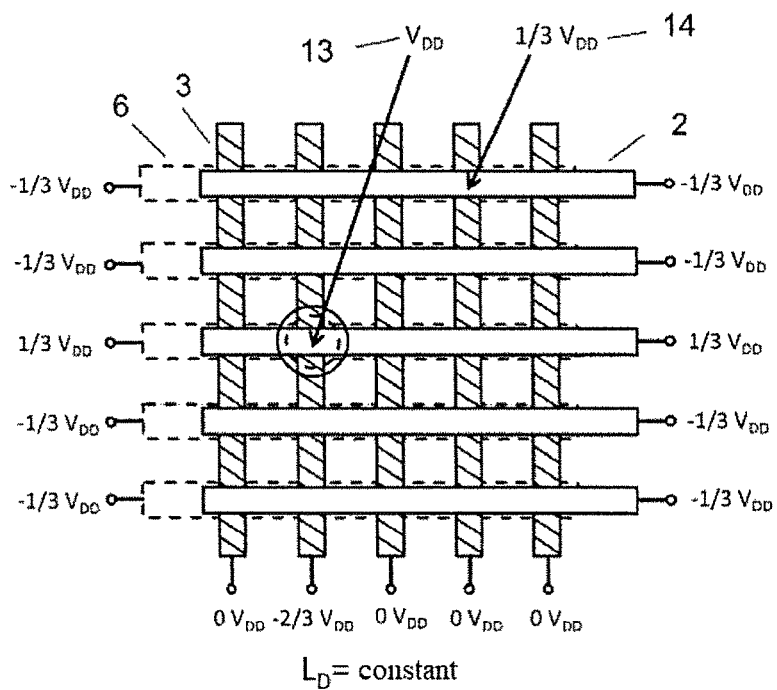
Figure 15:
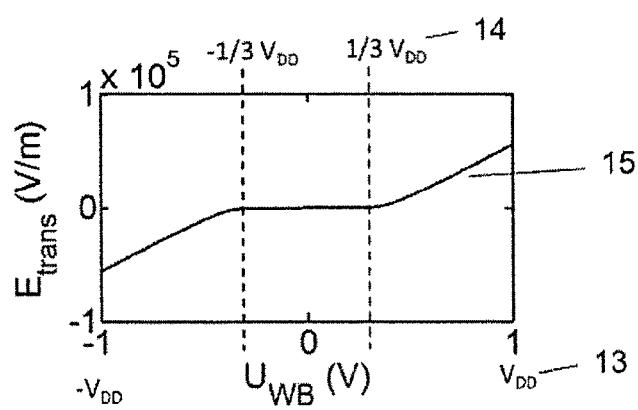
Figure 16:
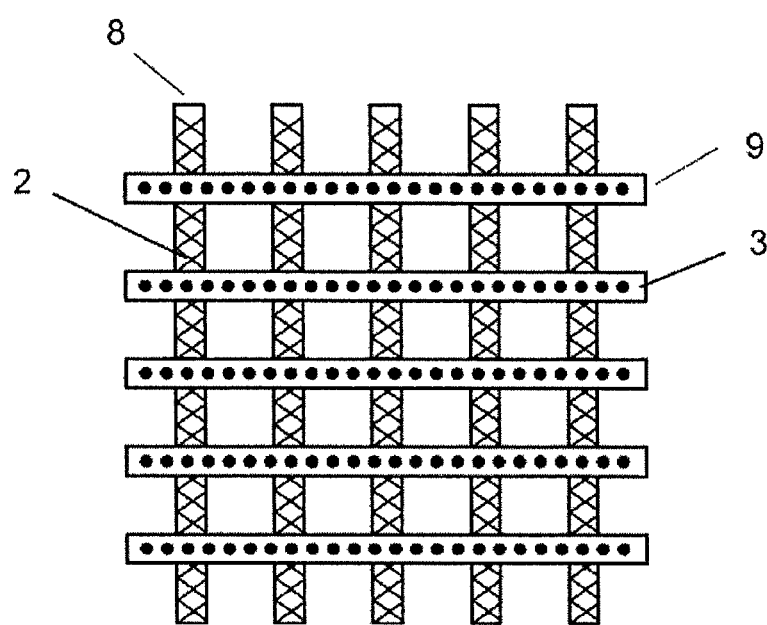

The invention shall be explained more closely in the following with the aid of exemplary embodiments. The corresponding drawings show FIG. 1 a top view of the matrix with strip reference electrode, FIG. 2 a top view of the matrix with whole-surface reference electrode, FIG. 3 a cross section view of the matrix with strip reference electrode, FIG. 4 a cross section view of the matrix with whole-surface reference electrode, FIG. 5 potential relations for a potential difference between selected bit line and reference electrode for the selected and non-selected word line, FIG. 6 potential relations for no potential difference between bit line and reference electrode for the selected and non-selected word line, FIG. 7 potential relations for measuring the electric field in the active medium, FIG. 8 favorable potential relations of the complete matrix when a potential difference is present between selected bit line and reference electrode (active medium situated between reference electrode (6) and word line (2)), FIG. 9 favorable potential relations of the complete matrix when no potential difference is present between selected bit line and reference electrode (active medium situated between reference electrode (6) and word line (2)), FIG. 10a a matrix with psn-junctions in longitudinal extension of the word lines laterally to them, FIG. 10b a matrix with psn-junctions at the end faces of the word lines FIG. 11 a matrix with metal-insulator junction material for the word line, FIG. 12 a transient response of the transmitted field of the word line and FIG. 13 a cross section view of a three-dimensional stacking of the matrix FIG. 14 a cross section view of the matrix with constant Debye-length in the word line, FIG. 15 a nonlinearity of the generated field, FIG. 16 a matrix with p-doped and n-doped strips, and FIG. 17 a cross section view of the matrix of claim 1.

DETAILED DESCRIPTION

FIG. 1 to FIG. 4 show a capacitive matrix arrangement, with an active medium 1. The active medium 1 is characterized in that it can be actuated with electric fields, or it may itself possess an electric polarization. The active medium 1 is embedded in a layer between a first set and a second set of respective parallel addressing electrodes, whereby the addressing electrodes of the first set form word lines 2 and the addressing electrodes of the second set form bit lines 3 of the matrix arrangement.

The word lines 2 and the bit lines 3 intersect at crossing points. At the crossing points, capacitor cells 4 which are selectable by actuation of the word lines 2 and bit lines 3 with the intervening active medium 1 are arranged.

In the following, $\Phi_R$ shall describe the potential of the reference electrode 5, 6, $\Phi_B$ the potential of the bit line 3 and $\Phi_W$ the potential of the word line 2.

Figure 5:
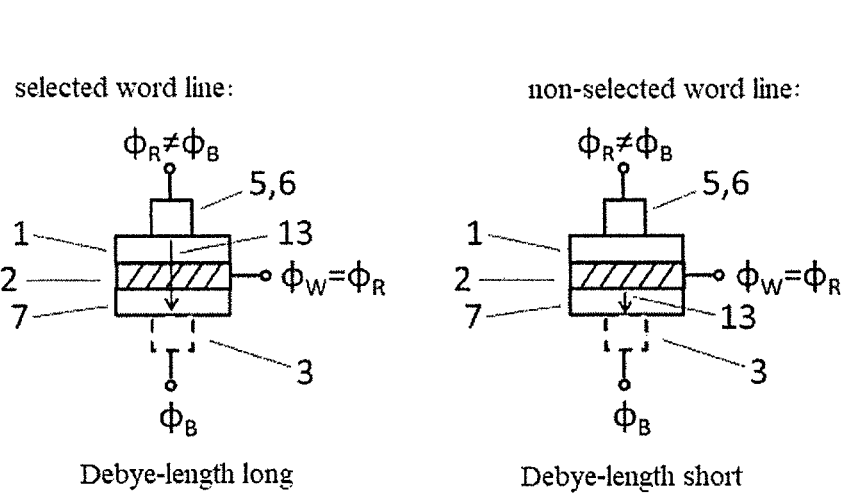

Now, in order to generate an electric field 13 at one point in the active medium 1 in the matrix, there are two possible methods, as mentioned above:

As shown in FIG. 5, between the selected bit line 3 and reference electrode 5, 6 in this case there exists a potential difference $\Phi_B \neq \Phi_R$ so that an electric field 13 is generated, as described in the first part of claim 2. If, now, a Debye-length is present in the word line 2 selected, such that the electric field 13 is well transmitted, an electric field 13 will be transmitted to the reference electrode 5, 6 at the crossing point between the selected word line 2 and the selected bit line 3, so that this can have an effect in an active medium, e.g., in the case of a ferroelectric, a polarization change which remains remanent. If, now, a short Debye-length is established in the word lines 2 not selected, the electric field 13 existing between the selected bit line 3 and the reference electrode 5, 6 will be interrupted. It must be taken into consideration that in this case the word line 2 behaves almost like a metal and an electric field 13 would be formed in event of a potential difference existing between word line 2 and reference electrode 5, 6 or bit line 3. Thus, if the active medium 1 is situated between word line 2 and reference electrode 5, 6, the potential of the word line 2 must accordingly be chosen to be identical to the reference electrode 5, 6, $\Phi_B = \Phi_R$. The field forming between word line and bit line in the non-active dielectric is no further hindrance, since the non-active dielectric plays no role other than that of an insulation. Otherwise, if the active medium 1 is situated between word line 2 and bit line 3, not represented in FIG. 5, the potential of the word line 2 should be chosen to be identical to the bit line 3, $\Phi_W = \Phi_B$.

As shown in FIG. 6, an identical potential may also be present between the selected bit line 3 and reference electrode 5, 6, $\Phi_B = \Phi_R$, whereby the electric field 13 in the active medium 1 this time is generated by a short Debye-length in the selected word line 2. The word line 2 then behaves again almost like a metal and if this has a potential difference to the bit line 3 and thus also to the reference electrode 5, 6 $\Phi_W \neq \Phi_B$, an electric field 13 will be generated in the active medium 1.

Now, if a long Debye-length is established on the word line 2 not selected, so that the potential of the bit line 3 and the reference electrode 5, 6 is well transmitted, the electric field 13 will vanish from the active medium 1. In this case, the word line potential can be chosen arbitrarily, since this no longer achieves any effect through the transmission. That is, the Debye-length between selection and non-selection behaves here precisely the reverse of the first case presented above.

The actuation of the complete matrix can occur in two different ways, depending on whether a potential difference exists between the selected bit line 3 and strip reference electrode 6 or not.

In the exemplary embodiments, a favorable choice of the non-selected potential is presented in order to reduce the number of capacitors which need to be charged, at least on the selected bit line 3 and selected reference electrode 6. In this case, charging in the active medium 1 must be avoided entirely, except in the selected capacitor cell 4. If charging is avoided in the non-active dielectric 7 along the selected bit line 3 and word line 2 at the same time, the time constant for the charging of the selected capacitor cell 4 can be reduced, which would mean a speed advantage in the case of storage.

FIG. 7 shows the detection of electric fields in the active medium. For this, the potentials of the word line 2, bit line 3 and the reference electrode 5, 6 are set equal to each other, and the Debye-length is altered in the word line 2 being selected, so that a current can be measured in the selected bit line 3 due to the influence of charges, since the electric field 13 of the active medium 1 which is located between the word line 2 and reference electrode 5, 6 performs a switching from transmission to shielding or vice versa. If the active medium 1 is located between bit line 3 and word line 2, then the current must be measured in the strip reference electrode 6.

Figure 8:
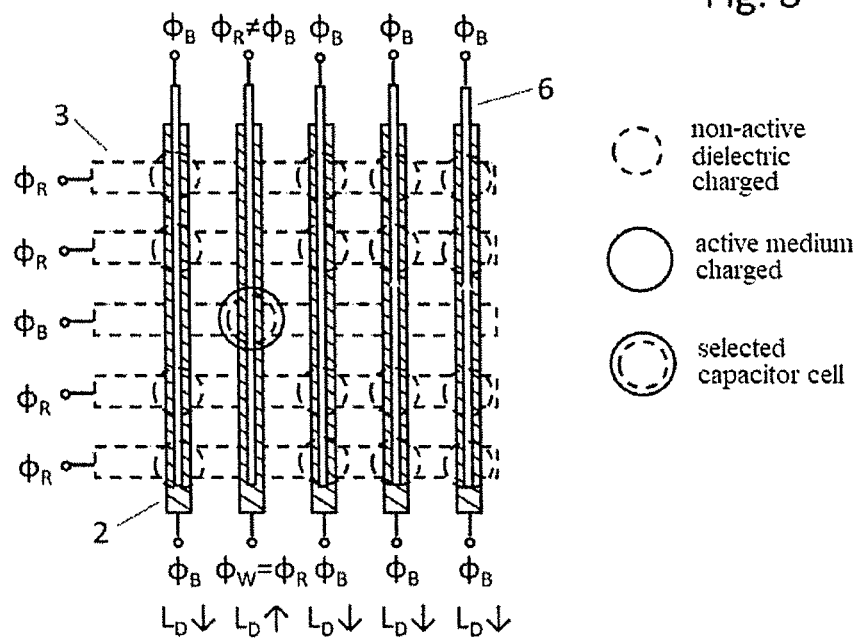

FIG. 8 shows first of all an exemplary embodiment for the case of a potential difference between bit line 5 and reference electrode 6. The active medium 1 is located between word line 2 and reference electrode 6. The reference electrodes 6 are arranged parallel to the word line 2 and an identical potential $\Phi_B$ to that imposed on the selected bit line 6 is imposed on the non-selected word lines 2 and non-selected strip reference electrodes 6. This ensures, on the one hand, that the active medium 1 is not charged in the non-selected word lines 2 and non-selected reference electrodes 6, since they both have the identical potential $\Phi_B$. At the same time, the non-selected word lines 2 has the identical potential as the selected bit line 3, so that a charging is avoided between word line 2 and selected bit line 3 in the non-active dielectric 7. Thus, the selected bit line 3 is charged only at the selected capacitor cell 4 where the word line 2 has been selected. A charging along the selected word line 2 that has a good transmission is avoided in that the potential of the non-selected bit lines 3 is chosen to be identical to that of the selected reference electrode $\Phi_R$. Thus, no potential difference exists between non-selected bit line 3 and selected reference electrode 6.

In this way, a charging occurs along the selected reference electrode 6 and the selected bit line 3 only in the place where the active medium 1 is to be altered in pointlike manner (in FIG. 8, the dashed and solid circle).

As represented by the dashed black circles in FIG. 8, a charging indeed takes place in the non-active dielectric at certain places outside the selected reference electrode 6 and selected bit line 3. But this charging is no further hindrance and could be decreased by high series resistors in order to reduce the energy consumption.

Figure 9:
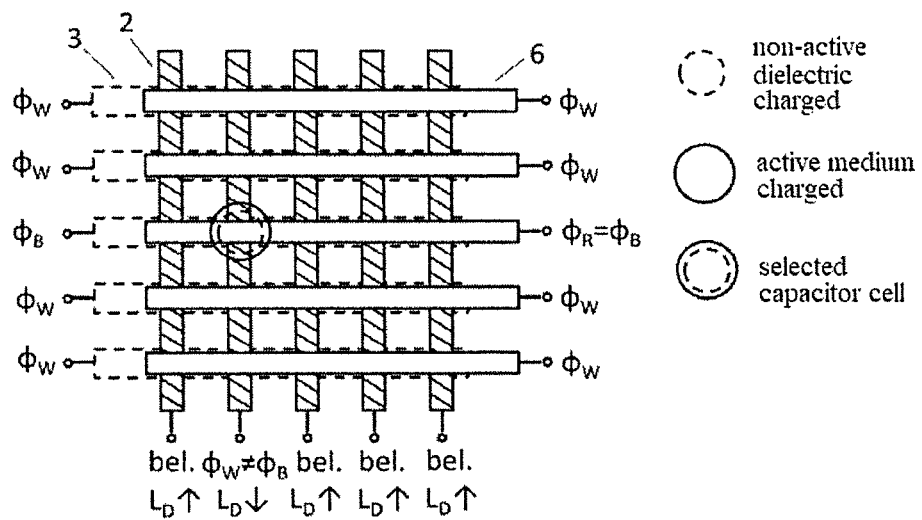

FIG. 9 shows a further exemplary embodiment. The strip reference electrodes 6 and bit lines 3 here may be oriented in parallel. In order to avoid a needless charging along the selected word line 2, non-selected bit lines 3 and non-selected reference electrodes 6 are placed at the same potential $\Phi_W$ as the selected word line 2. In this way, charging is avoided both in the active medium 1 and the non-active dielectric 7. In this method, charging occurs only in the selected capacitor cell 4, which would provide advantages over claim 4.

Figure 10A:
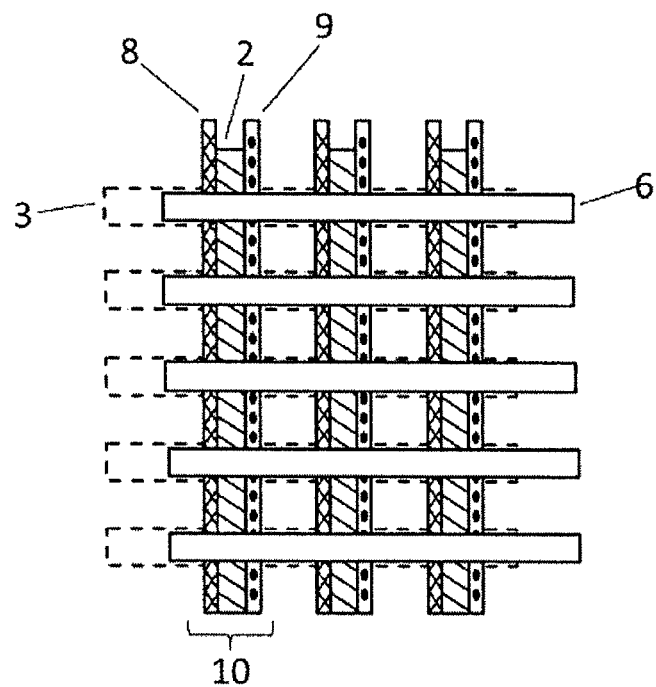
Figure 10B:
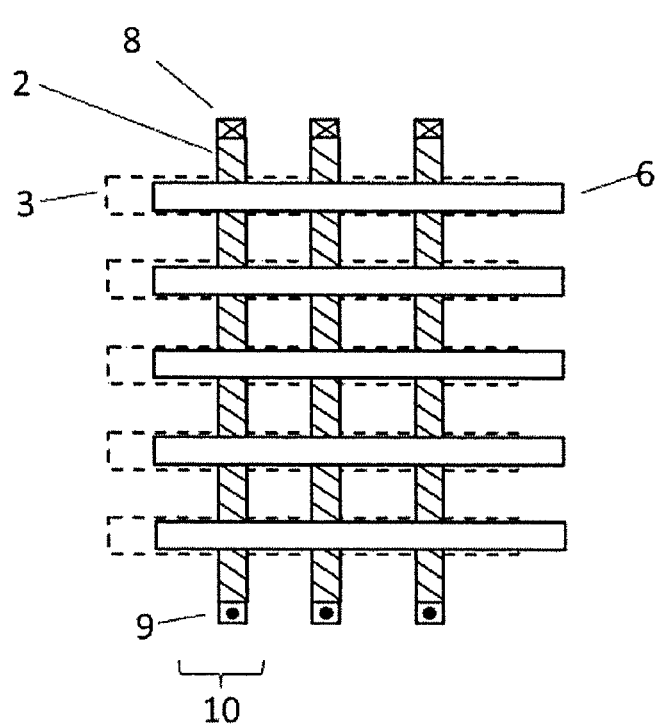

As represented in FIG. 10a and FIG. 10b, the capacitive matrix arrangement according to the invention can be constructed from psn-junctions. The word lines 2 may consist of a slightly doped semiconductor and are joined together by means of alternating p-regions and n-regions 8, 9. The electric field in the slightly doped region will be transmitted. The level of the doping in the p-regions and n-regions 8, 9 should be chosen high enough for the entire junction to have a symmetrical band pattern and for this to occur by antisymmetrical voltages, thereby achieving an equalization and not generating any interference field in the slightly doped region. If the psn-junction is operated in the blocking direction, the word line 2 will be depleted and the perpendicular field will be well transmitted; in forward direction, the field would be well shielded.

According to FIG. 10a, the respective p-doped region 8 is arranged parallel to the lengthwise extension of the word line 2 on the one side and the n-doped region 9 is likewise arranged parallel to the lengthwise extension of the word line 2, but on the other side of the word line 2.

According to FIG. 10b, the respective p-doped region 8 is arranged at the one end face of the word line 2 and the respective n-doped region 9 is arranged at the other end face of the word line 2.

Schottky contacts may likewise be used, making possible a much faster data access, e.g. for storages.

As shown in FIG. 11, a rapid data access and in addition a reduced energy consumption can be accomplished with a metal-insulator junction in the word line 2. For this, a current is carried by the word lines 2 which produces a slight temperature rise and thus brings about a transition from the metallic to the insulating state. A further advantage of this arrangement is that the interference voltages are very low, unlike the case of the imperfectly symmetrical psn or Schottky contacts.

In regard to ferroelectric storage, the active medium is replaced by a ferroelectric. Furthermore, the way to a 3D integration would be clear, by stacking several such matrix structures one on another. Moreover, the read out of the polarization state is nondestructive, since the structure serves at the same time as a field detector. Destructive read out was one of the major problems of conventional ferroelectric storages. The access speed in present ferroelectric storages is primarily limited by the resistance of the transistors. With metallic bit lines 3 and reference electrodes 5, 6, this resistance would be much lower. Furthermore, the modulation of the semiconductor could occur with Schottky contacts, which have a very fast response. By means of suitable actuation of the matrix, the capacitances of the bit lines 3 and the reference electrodes 6 could be reduced. These three aspects, taken together, could result in faster access and write times than for conventional FeRAMs. If in addition SrTiO3 or TiO2 is used as the semiconductor material, benefits will result from the higher dielectric constant and similar crystal structures to the ferroelectric perovskite, so that the problem of lack of CMOS compatibility between ferroelectrics and silicon will be solved.

Besides a ferroelectric as the active storage medium, one could also use ions drifting through a solid. Depending on the position of the ions in the material, the transmitted field through the word lines 2 will be different.

One peculiarity of the transmission behavior through the word lines 2 is that the potential bending has extremely nonlinear behavior per $$\frac{d^2\Psi}{dx^2} = \frac{2en}{\varepsilon_0\varepsilon_r} \cdot \sinh\frac{\Psi}{U_T}$$

with

Ψ: the potential in the solid $U_T$: the temperature stress.

Figure 12:
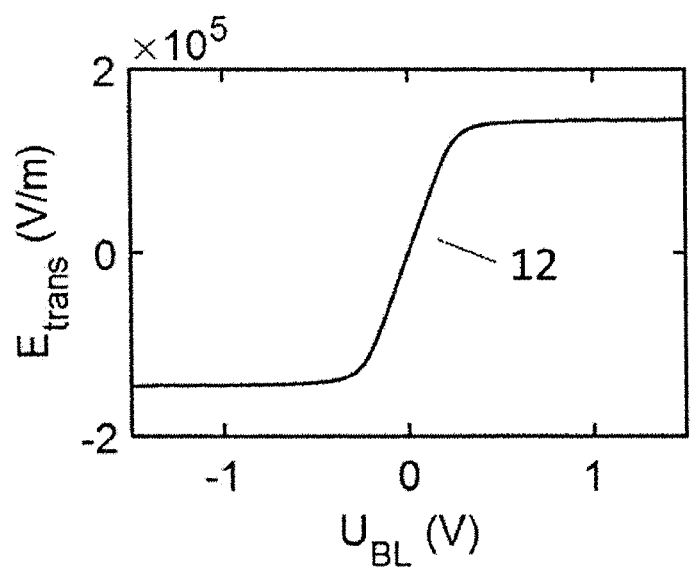

The aforementioned Debye-length with an exponential decline of the potential or field through the word line 2 holds only for relatively small potentials and fields and results from a linearization of the above given differential equation. If the field is intensified, the nonlinearity of the differential equation becomes dominant and the transmitted field undergoes saturation. A sigmoidal relation 12, as shown in FIG. 12, results between the bit line voltage $U_{BL}=\Phi_B-\Psi_B$, the potential difference between bit line potential and reference electrode potential, and the transmitted field. A neuron in an artificial neural net, in turn, exhibits a very similar behavior, as already mentioned, and the possibility would exist, as mentioned in claim 15, of using this behavior to model the activation function of a neuron, wherein the active medium with a storage function can play the part of the synapse, or the adaptive adjustment possibility of the transmitted field with the Debye-length may also provide for the synaptic weighting. In this way, neuron and synapse would be combined to form a component and no further disadvantageous transistor circuit would be needed, which would also simplify a three-dimensional structuring of the artificial neural nets. The nonlinearity 15 in FIG. 15 can be used to model Rectified Linear Units (ReLU).

Figure 13:
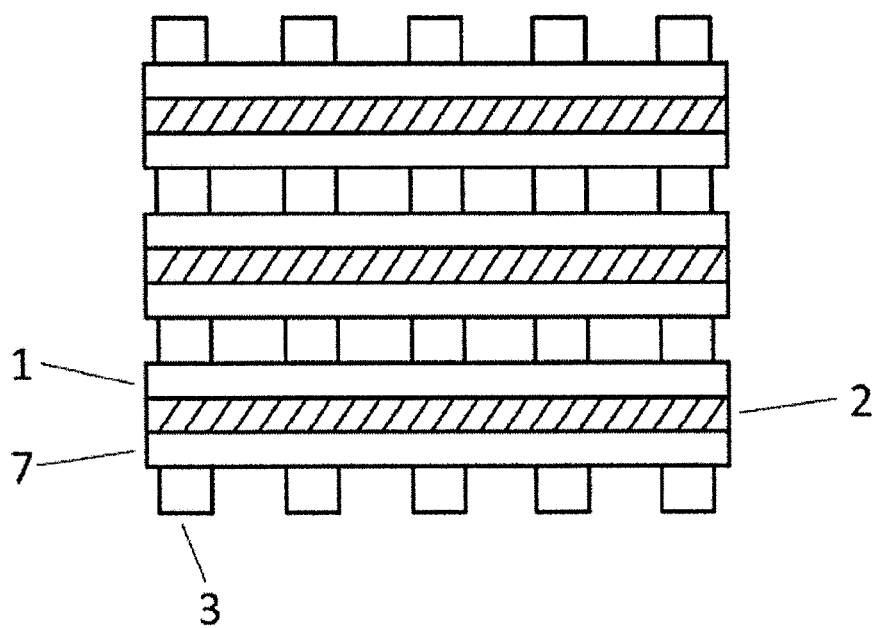

As is shown in FIG. 13, several such matrix devices can be stacked in three dimensions, wherein the reference electrode 6 of the one matrix at the same time forms the bit line 3 of the matrix situated above it. This arrangement is primarily advantageous for storage applications, since the storage density can be substantially increased in this way.

According to FIG. 14 to FIG. 18, an arrangement is used [having] word lines 2 and bit lines 3, which are preferably arranged perpendicular to each other, while the word lines 2 consist of a semiconductor with p-doped regions 8 and the bit lines 3 of a semiconductor with n-doped regions 9. The level of the doping is chosen to be such that the Fermi levels of the p-doped regions 8 and the n-doped regions 9 have the same distance from the Fermi level of the word lines 2 and the band model of the resulting psn-junction 10 possesses symmetry.

At their crossing points, the strip reference electrode 6 is connected across the p-doped region 8 and the bit line 3 across the n-doped region 9 respectively to the word line 2. This becomes especially clear in the representation of FIG. 17.

Figure 17:
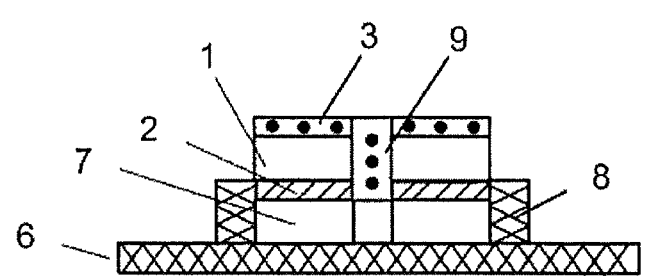

The semiconductors at the crossing point may be intrinsically or slightly doped, for example, so that pin junctions or psn-junctions are formed. The p-doped region 8, as shown in FIG. 17, may consist of individual elevations along the strip and the n-doped region 9 may consist of a T-shaped strip. The active medium 1 can then be between the n-region 9 and the p-region 8 and the non-active medium 7 between the p-region 8 and n-region 9. It would also be possible to arrange an active medium at both places. In FIG. 17, two storage cells are placed alongside each other.

Thanks to the form of the p-regions and n-regions, these act at the same time as gate and strip reference electrode 6, creating the field. The depletion or enrichment of the semiconductor region at the crossing points occurs with the same voltage, so that the change in the Debye-length and the voltage between reference electrode 6 and gate electrode no longer needs to be adjusted separately. Furthermore, a pointlike depletion or enrichment in the matrix can be achieved through suitable choice of the voltages.

Independently of the exemplary embodiment presented above, a method can be used in which the bit lines 3 and the strip reference electrodes 6 are arranged in parallel and the word lines 2 are arranged preferably perpendicular to them and no potential difference exists between the bit line 3 and strip reference electrode 6. The Debye-length in the word lines 2 is held constant and the potentials on the word lines 2, bit lines 3 and strip reference electrodes 6 are chosen such that the potential difference between bit line 3 and word line 2 is present at the selected capacitor cell as the full voltage 13 and ⅓ of the full voltage 14 is present at the non-selected capacitor cells and the nonlinearity 15 of the generated field is used to suppress the field in the non-selected capacitor cells.

One may interpret this manner of actuation as being a kind of capacitive diode, which generates an electric field starting at a particular threshold voltage. This circumstance is made clear by FIG. 15, since for low voltages the potential bending in the semiconductor is hardly significant and the potential is continued between bit line 3 and strip reference electrode 6. Since no potential difference is present between bit line 3 and strip reference electrode 6, no field is formed. Starting with a certain threshold voltage, however, the potential bending in the semiconductor is so great that the potential difference between word line 2 and bit line 3, as well as that between word line 2 and strip reference electrode 6, becomes significant and a linear rising electric field is created. Thus, with the usual ⅓ approach of the prior art, a high on/off switching relationship should result.

In this way, no recharging is required in the word line, so that the storage has lower energy consumption and faster access times.

LIST OF REFERENCE NUMBERS

1 Active medium
2 Word line
3 Bit line
4 Capacitor cell
5 Whole-surface reference electrode
6 Strip reference electrode
7 Non-active dielectric
8 p-doped region
9 n-doped region
10 psn junction
11 Current flow
12 Sigmoidal transient response
13 Full voltage
14 ⅓ of full voltage
15 Nonlinearity

The invention claimed is:

1. A capacitive matrix arrangement, comprising an active medium, which is embedded in a layer between a first set and a second set of respective parallel addressing electrodes, wherein the addressing electrodes of the first set form word lines and the addressing electrodes of the second set form bit lines of the capacitive matrix arrangement, wherein the word lines and the bit lines intersect at crossing points and capacitor cells with an intervening active medium are arranged at the crossing points, being selectable by actuation of the word lines and the bit lines, wherein word lines at least in an area of the crossing points consist of a material with variable Debye length, i.e., a material with variable mobile charge carrier concentration, and are arranged between the active medium and a non-active dielectric, forming a layered arrangement, and the layered arrangement is situated between a reference electrode and the bit lines, and wherein a first layer of the layered arrangement is chosen such that the active medium as seen from a word line is situated on a side); with the reference electrode and alternatively a second layer of the layered arrangement is chosen such that the active medium as seen from the word line is situated on with the bit lines.

2. The capacitive matrix arrangement as claimed in claim 1, wherein the reference electrode consists of multiple striplike strip reference electrodes, wherein the strip reference electrodes are formed corresponding to the bit lines and are individually actuable.

3. The capacitive matrix arrangement as claimed in claim 2, wherein the word lines consist of a semiconductor and are provided with p-doped and n-doped regions, wherein a level of doping is chosen such that Fermi levels of the p-doped and n-doped regions have a same distance from a Fermi level of the word lines and a band model of a resulting psn-junction possesses symmetry.

4. The capacitive matrix arrangement as claimed in claim 3, wherein the p-doped and n-doped regions are situated either to a side of a longitudinal extension of a respective word line or at an end face.

5. The capacitive matrix arrangement as claimed in claim 3, wherein the strip reference electrodes and the bit lines cross each other and at the crossing points a strip reference electrode is connected a word line across the p-doped region and a bit line across the n-doped region or the strip reference electrode is connected across the n-doped region and the bit line across the p-doped region, respectively.

6. The capacitive matrix arrangement as claimed in claim 1, wherein the word lines consist of a semiconductor and are provided with different metal regions forming the a Schottky contacts, wherein a work function of the metal regions is chosen such that distances of Fermi levels between the metal regions and the semiconductor are identical and a band model is symmetrical.

7. The capacitive matrix arrangement as claimed in claim 2, wherein a material with a metal-insulator junction is used for the word lines.

8. The capacitive matrix arrangement as claimed in claim 7, wherein the active medium is an electrically polarizable dielectric storage material for a storage of data.

9. The capacitive matrix arrangement as claimed in claim 7, wherein the active medium is a liquid-based or electrophoretic display means.

10. The capacitive matrix arrangement as claimed in claim 7, wherein the capacitive matrix arrangement involves a modeling of an activation function of an artificial neuron with a sigmoidal transmission behavior of the word lines or with a nonlinearity of the generated electric field.

11. A method for an actuation of a capacitive matrix arrangement as claimed in claim 1, wherein a capacitor arrangement situated at a crossing point between a word line and a bit line is selected by a potential selection of a word line being selected and corresponding to the crossing point and a bit line being selected and corresponding to the crossing point, wherein when setting a state of the active medium
  an electric field is generated in a capacitor cell being selected by
    applying a potential difference between the bit line being selected and the reference electrode in a case of the first layer of the layered arrangement and selecting the potential of the word line being selected to be identical to the reference electrode,
    or, in a case of the second layer of the layered arrangement, by selecting the potential of the word line to be identical to the bit line, and by generating in the word line being selected a long Debye-length, i.e., a mobile charge carrier concentration which is so low that a sufficiently strong field is transmitted, producing an action in the active medium such that an electric field is transmitted at the crossing point to the bit line being selected, while at a word lines not being selected a short Debye-length is generated, i.e., a mobile charge carrier concentration which is so high that no action is produced in the active medium, and thus a poor transmission is established, or no potential difference is present between the bit line being selected and the reference electrode, and the potential of the word line being selected is chosen to be different from the reference electrode and the bit line, and the Debye-length of the word line is chosen to be short, and field lines of an electric field respectively end principally at the word line, so that the action is produced in the active medium, wherein a long Debye-length is established at the word lines not selected, so that the action is produced in the active medium, or the Debye-length in the word lines is held constant and the potentials on the word lines, the bit lines and strip reference electrodes are chosen to be such that a potential difference between the bit line and the word line at the selected capacitor cell is present as a full voltage and at a capacitor cells not selected a portion of the full voltage is present, preferably ⅓, and a nonlinearity of the generated electric field ensures a suppression of a field in the capacitor cells not selected, and when determining a state of an active medium in the capacitor cell being selected, an electric field s measured by choosing the potentials of the bit lines, the strip reference electrodes and the word lines to be identical, and in the case of the first layer of the layered arrangement, a current is measured in the selected bit line that is generated during a changing of the Debye-length in the selected word line, and in the case of the second layer of the layered arrangement, a current is measured in a strip reference electrode corresponding to the crossing point.

12. The method as claimed in claim 11, wherein a actuation of the complete matrix in the case of the first layer of the layered arrangement, is done in such a way that, when a potential difference is present between a strip reference electrode corresponding to the crossing point and a corresponding bit line, an identical potential to that of the bit line being selected is applied to the word lines not being selected and strip reference electrodes not selected, and bit lines not being selected are provided with an identical potential to a corresponding strip reference electrode, and in the case of the second layer of the layered arrangement, it is done in such a way that, when the potential difference is present between a strip reference electrode corresponding to the crossing point and the corresponding bit line, an identical potential to the corresponding strip reference electrode is applied to the word lines not being selected and the bit lines not being selected, and other strip reference electrodes are provided with the identical potential to that of the bit line being selected.

13. The method as claimed in claim 11, wherein an actuation of the complete matrix occurs in such a way that, when no potential difference is present between the selected bit line and selected strip reference electrode, with the strip reference electrodes and bit lines being arranged in parallel, bit lines not being selected and strip reference electrodes not being selected are placed at a same potential as the selected word line and the potential of the word lines not being selected can be chosen arbitrarily.

14. The method as claimed in claim 11, wherein a blocking voltage is applied to the psn-junctions to deplete a mobile charge carrier concentration in the word lines, insofar as the long Debye-length is desired, and a forward voltage is applied to enrich the mobile charge carrier concentration in the word lines, insofar as the short Debye-length is desired, each time applying an antisymmetrical voltage to the p-regions and n-regions.

15. The method as claimed in claim 11 for an actuation of the matrix arrangement, wherein a current flow through the word line being selected produces a slight temperature rise and a metal-insulator junction triggers a change in the mobile charge carrier concentration in the word line being selected.

16. The capacitive matrix arrangement as claimed in claim 1, wherein the word lines consist of a semiconductor and are provided with p-doped and n-doped regions, wherein a level of doping is chosen such that Fermi levels of the p-doped and n-doped regions have a same distance from a Fermi level of the word lines and a band model of a resulting psn-junction possesses symmetry.

17. The capacitive matrix arrangement as claimed in claim 1, wherein the word lines consist of a semiconductor and are provided with different metal regions forming a Schottky contacts, wherein a work function of the metal regions is chosen such that distances of Fermi levels between the metal regions and the semiconductor are identical and a band model is symmetrical.

18. The capacitive matrix arrangement as claimed in claim 1, wherein the active medium is an electrically polarizable dielectric storage material for storage of data.

19. The capacitive matrix arrangement as claimed in claim 1, wherein the active medium is a liquid-based or electrophoretic display means.

20. The capacitive matrix arrangement as claimed in claim 1, wherein the capacitive matrix arrangement involves a modeling of an activation function of an artificial neuron with a sigmoidal transmission behavior of the word lines or with a nonlinearity of a generated electric field.

* * * * *

UNITED STATES PATENT AND TRADEMARK OFFICE
CERTIFICATE OF CORRECTION

PATENT NO.        : 10,504,575 B2
APPLICATION NO.   : 16/340595
DATED             : December 10, 2019
INVENTOR(S)       : Demasius et al.

Page 1 of 1

It is certified that error appears in the above-identified patent and that said Letters Patent is hereby corrected as shown below:

In the Claims

Column 14, Line 6: Claim 1, Delete "on with" and insert -- on a side with --

Column 14, Line 32: Claim 6, Delete "the a Schottky" and insert -- a Schottky --

Column 14, Line 42: Claim 8, Delete "for a storage" and insert -- for storage --

Column 14, Line 50: Claim 10, Delete "of the generated" and insert -- of a generated --

Column 16, Line 26: Claim 15, Delete "the matrix arrangement" and insert -- the capacitive matrix arrangement --

Signed and Sealed this
Fourth Day of February, 2020

Andrei Iancu
*Director of the United States Patent and Trademark Office*